United States Patent
Griffin, Jr. et al.

(10) Patent No.: US 8,236,703 B2
(45) Date of Patent: Aug. 7, 2012

(54) METHODS FOR REMOVING CONTAMINANTS FROM ALUMINUM-COMPRISING BOND PADS AND INTEGRATED CIRCUITS THEREFROM

(75) Inventors: Alfred J. Griffin, Jr., Dallas, TX (US); Lisa A. Fritz, Dallas, TX (US); Lin Li, Plano, TX (US); Lee Alan Stringer, Frisco, TX (US); Neel A. Bhatt, Allen, TX (US); John Paul Campbell, Dallas, TX (US); Stephen Arlon Meisner, Allen, TX (US); Charles Leighton, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 847 days.

(21) Appl. No.: 12/208,608

(22) Filed: Sep. 11, 2008

(65) Prior Publication Data

US 2009/0068847 A1   Mar. 12, 2009

Related U.S. Application Data

(60) Provisional application No. 60/971,669, filed on Sep. 12, 2007, provisional application No. 60/971,673, filed on Sep. 12, 2007.

(51) Int. Cl.
   *H01L 21/302* (2006.01)
(52) U.S. Cl. ........ 438/754; 438/612; 438/613; 438/614; 438/634; 216/37; 216/67
(58) Field of Classification Search .......... 438/612–614, 438/627, 634, 754; 216/37, 67
See application file for complete search history.

(56) References Cited

U.S. PATENT DOCUMENTS

| | | | |
|---|---|---|---|
| 5,376,235 A * | 12/1994 | Langley | 438/754 |
| 5,380,401 A | 1/1995 | Jones et al. | |
| 5,908,319 A * | 6/1999 | Xu et al. | 438/725 |
| 6,376,353 B1 * | 4/2002 | Zhou et al. | 438/612 |
| 6,924,172 B2 | 8/2005 | Roche et al. | |
| 7,055,532 B2 | 6/2006 | Tsai et al. | |
| 7,354,865 B2 | 4/2008 | DiCarlo et al. | |
| 7,479,474 B2 * | 1/2009 | Cernat et al. | 510/175 |
| 2007/0298547 A1 * | 12/2007 | Hu et al. | 438/132 |

* cited by examiner

*Primary Examiner* — Nadine G Norton
*Assistant Examiner* — Maki Angadi
(74) *Attorney, Agent, or Firm* — Warren L. Franz; Wade J. Brady, III; Frederick J. Telecky, Jr.

(57) ABSTRACT

Methods for removing contaminants from a semiconductor device that includes a plurality of aluminum-comprising bond pads on a semiconductor surface of a substrate. A plurality of aluminum-including bond pads are formed on the semiconductor surface of the substrate. A patterned passivation layer is then formed on the semiconductor surface, wherein the patterned passivation layer provides an exposed area for the plurality of bond pads. Wet etching with a basic etch solution is used to etch a surface of the exposed area of the aluminum-including bond pads, wherein the wet etching removes at least 100 Angstroms from the surface of the bond pads to form a cleaned surface.

19 Claims, 2 Drawing Sheets

METHODS FOR REMOVING CONTAMINANTS FROM ALUMINUM-COMPRISING BOND PADS AND INTEGRATED CIRCUITS THEREFROM

CROSS REFERENCE TO RELATED APPLICATIONS

This application claims the benefit of Provisional Application Ser. No. 60/971,669 entitled "REMOVAL OF CONTAMINANTS ON BOND PADS FOR STRESS BUFFER LAYER INTEGRATION" filed Sep. 12, 2007, and Provisional Application Ser. No. 60/971,673 entitled "PRE-RESIST STRIP WET PROCESS FOR IMPROVED BONDABILITY" filed Sep. 12, 2007, both of which are herein incorporated by reference in their entireties.

FIELD

Embodiments of the present invention relate to methods of fabricating integrated circuits, and more particularly, to methods for removing residual contaminant compounds from aluminum-comprising bond pad surfaces.

BACKGROUND

After the terminal metal bond pads are defined and etched on a semiconductor wafer, a passivation layer, generally $SiO_2$, SiON, or SiN or combinations thereof, is deposited on the wafer to protect the die from chemical or mechanical damage, including that which may be incurred from the subsequent manufacturing process steps. In some processes, a stress buffer layer (SBL) is added, such as a polyimide, on top of the passivation layer.

Passivation-related processing is known to leave behind contaminant compounds including aluminum compounds on the bond pad surface. For example, in the case of a polyimide SBL, processing can cause various compounds to be formed on the bond pads, such as $Al_xF_yO_z$. Such compounds on the bond pad surface are not desirable because they result in non-optimal wire bonds and cause the affected wafers to fail quality control wire-bondability testing or result in related failures over time. These defects are non-reworkable and the affected wafers or die are generally scrapped. Accordingly, effective methods for removing contaminants from aluminum-comprising bond pads are needed. Such methods should provide significantly enhanced bond pull strength and not result in significant undercut of the bond pads under the passivation layer.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe methods for removing contaminants from a semiconductor device comprising a plurality of aluminum-comprising bond pads on a semiconductor surface of a substrate. A plurality of aluminum-comprising bond pads are formed on the semiconductor surface. A patterned passivation layer is then formed on the semiconductor surface, wherein the patterned passivation layer provides an exposed area for the plurality of bond pads. Wet etching with a basic etch solution is used to etch a surface of the exposed area of the aluminum-comprising bond pads, wherein the wet etching removes at least 50 Angstroms, and generally removes at least 100 Angstroms, to form a cleaned surface. The % F at the cleaned surface is generally <7 wt. % after etching. In some embodiments of the invention, the basic etch solution is exclusive of any corrosion inhibitors.

In other embodiments of the invention, the bond pad etching can remove 150 Angstroms to 1,000 Angstroms from the surface of the plurality of bond pads. In various embodiments, the bond pads can comprise Al/Cu, wherein Cu comprises 0.3 to 2 wt. %, or various Al/Si or Al/Si/Cu always having generally <2 wt. % alloying materials.

The basic etch solution can comprises a hydroxide comprising base, such as an ammonium hydroxide comprising base. For example, the ammonium hydroxide comprising base can comprise tetramethylammonium hydroxide (($CH_3$)$_4$NOH; hereafter "TMAH").

Embodiments of the invention provide removal of contaminants from bond pad surfaces for processes that include stress buffer layers (SBLs). In one embodiment, the wafer includes a sacrificial dielectric layer on the passivation layer and a SBL on the sacrificial dielectric layer, wherein the method further comprises the step of removing the sacrificial dielectric layer before the wet etching. The SBL can comprise a polybenzoxazole or a polyimide.

In another embodiment of the invention the forming of the patterned passivation layer comprises depositing an unpatterned passivation layer, forming a patterned resist layer on the unpatterned passivation layer, etching the unpatterned passivation layer to form the patterned passivation layer, and removing the patterned resist layer after the wet etching step. In another embodiment of the invention, the patterned resist layer can be removed before the wet etching step.

DETAILED DESCRIPTION

Figure 1:
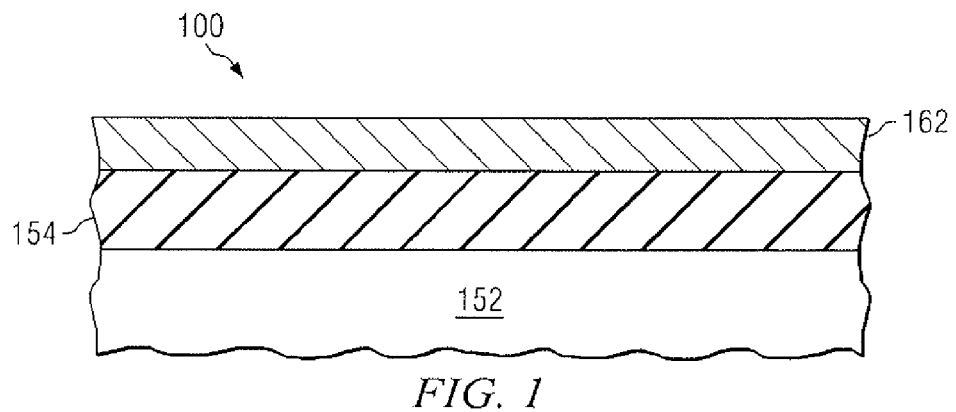
FIGS. 1-5 are cross sectional views of a portion of a semiconductor device at various intermediate sequential stages of fabrication, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention describe methods for removing contaminants from a semiconductor device comprising a plurality of aluminum-comprising bond pads on a semiconductor surface of a substrate using a basic etch solution that etches the surface of the bond pads. Etching the bond pad surface to clean the surface is the antithesis of conventional bond pad cleans which use chemicals that are designed to avoid any significant etching the bond pads by ensuring extremely low etch rates of the bond pad (e.g. about 1 Angstrom/min), and may also add a corrosion inhibitor to further reduce the etch rate. Although the amount of etched bond pad material to achieve a clean surface and resulting high bond strength generally depends on the particular prior surface treatment of the bond pad surface, the present inventors have found that by etching generally at least 100 Angstroms, and typically at least 150 to 500 Angstroms, the process margin to achieve the desired clean bond pads is generally achieved.

Referring to FIG. 1, a cross sectional view of a portion of a semiconductor device 100 at a first intermediate stage of fabrication is shown. FIGS. 2-5 show the device 100 after additional sequential process steps. The semiconductor substrate 152 can be single crystal silicon, gallium arsenide, silicon-on-insulator (SOI), the like, or combinations of the above. Although not shown, the semiconductor substrate 152 may include various structures, such as transistors, metal layers and the like, as known to one skilled in the art. In the embodiment discussed, the exposed layer of the semiconductor substrate is a metal layer, generally being an aluminum alloy, such as alloyed with copper, and/or silicon. In one embodiment, the plurality of bond pads can comprises Al/Cu, wherein Cu comprises 0.3 to 2 wt. %.

A dielectric layer 154 (also shown in FIGS. 2-5 after additional processing) is formed over the semiconductor substrate 152 generally by chemical vapor deposition (CVD), physical vapor deposition (PVD), atomic layer deposition (ALD), the like or combinations of the above. The dielectric layer 154 is an intermetal dielectric (IMD), which electrically isolates metal regions/layers from each another. Thus, the dielectric layer 154 is formed to isolate the exposed layer (not shown) of the semiconductor substrate from subsequently formed electrically conductive layers. Typically, the dielectric layer 154 is silicon dioxide ($SiO_2$), but it can be any dielectric material, such as a low dielectric constant (low-k) material. A low-k material is defined herein as a material with a dielectric constant less than that of silicon dioxide.

After forming the dielectric layer 154, a bond pad (metal) layer 162 is formed on the dielectric layer 154, such as by deposition processing. The bond pad layer is generally about 0.5 to 1.5 µm thick. A barrier layer, such as a refractory metal comprising material (not shown), can be interposed between the bond pad layer 162 and the dielectric layer 154.

Figure 2:
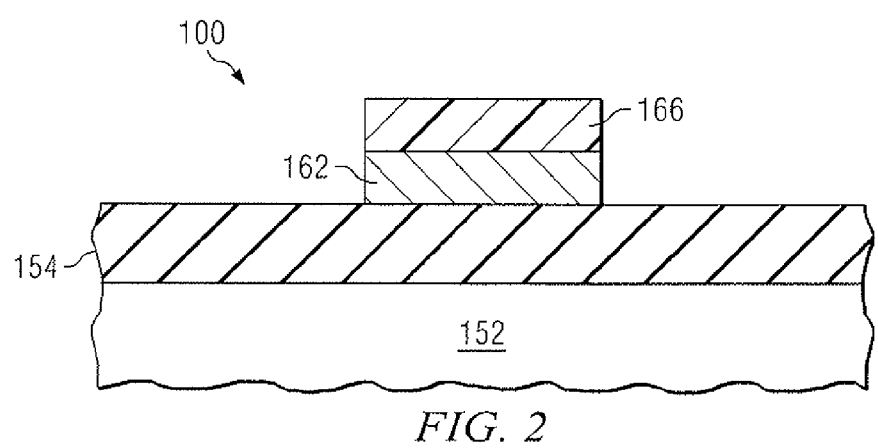

As shown in FIG. 2, after forming the bond pad layer 162, the bond pad layer 162 is patterned by depositing and patterning a masking layer such as a photoresist layer 166 and then etching the bond pad layer 162 using well known methods. After etching the bond pad layer 162, a first clean process (post metal etch clean) is performed to remove particles on the surface of the dielectric layer 154 that may remain from the etch process. After the first clean process, such as a wet clean, the photoresist 166 is removed, such as using an in situ ash process. An ash is generally performed by exposing the device 100 to an oxygen ($O_2$) plasma environment. Next, the device 100 can be sintered to anneal residual charges created from the metal etching process.

Figure 3:
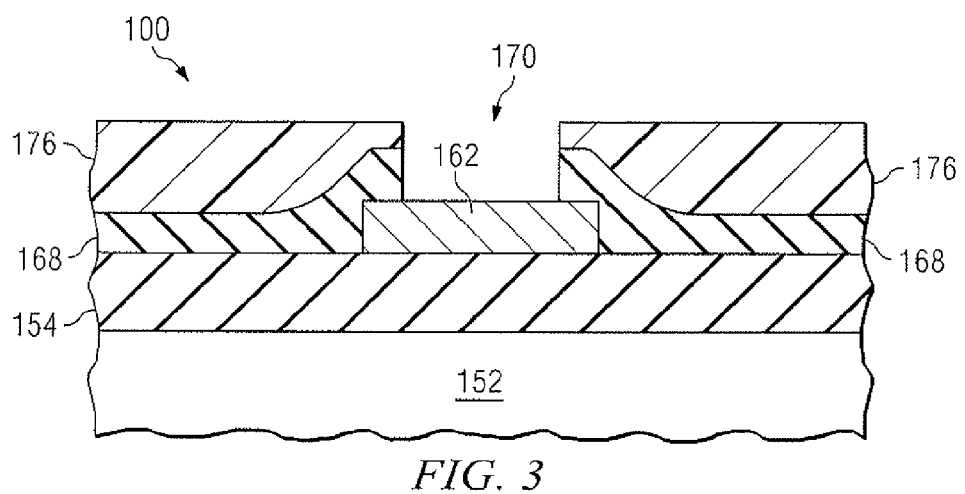

After sintering, a patterned passivation layer 168 is formed over the semiconductor device 100, as shown in FIG. 3 by depositing and patterning a masking layer such as a photoresist layer 176 and then etching the passivation 162 using well known methods to form openings 170. The passivation layer 168 is a protective coating that protects underlying layers from particles, scratches and moisture. The passivation layer 168 can be silicon nitride (SiN), silicon oxynitride (SiON), phosphosilicate glass (PSG), silicon dioxide ($SiO_2$) or any other suitable material formed by CVD, PVD, ALD, the like or combinations of the above. Generally, a dry etch process is used to form the first opening 170 as known in the art. The first opening 170 is where the bond pad will be exposed after processing is completed.

In embodiments of the invention that do not include a SBL, wet etching the surface of the bond pad according to embodiments of the invention can be performed with the photoresist layer 176 on the device 100, or after removal of the photoresist layer 176. The wet etching comprises use of a basic etch solution. The wet etching removes at least 50 Angstroms, and generally at least 100 Angstroms from the surface of the bond pad to form a cleaned surface. In embodiments of the invention the bond pad etching removes 150 Angstroms to 1,000 Angstroms from the surface of the bond pads. The etched amount generally represents about 2 to 15% of the as-deposited bond pad thickness.

The basic etch solution generally has a pH from 11 to 13.9. The basic etch solution can comprise one or more hydroxides, such as an ammonium hydroxide. In one embodiment, the basic etch solution includes at least one ammonium hydroxide carbon comprising base, such as TMAH. In one particular embodiment, the basic etch solution consists essentially of 1 to 4% of TMAH in water along with an optional surfactant. In this particular embodiment, the etch time can be from 30 to 60 seconds and can result in etching 300 to 800 angstroms of Al/Cu, 0.5 wt. % Cu. The basic etch solution is generally exclusive of any corrosion inhibitors, since the object of embodiments of the invention is generally to etch the bond pad surface, albeit generally only from 50 Angstroms to 1,000 angstroms. The wet etch can be performed at or near room temperature, or at an increased temperature (e.g. 50 to 70° C.) to increase the etch rate, which may however sacrifice the etch uniformity. In one embodiment of the invention, the wet etch using the basic solution can utilize a spray tool.

Figure 4:
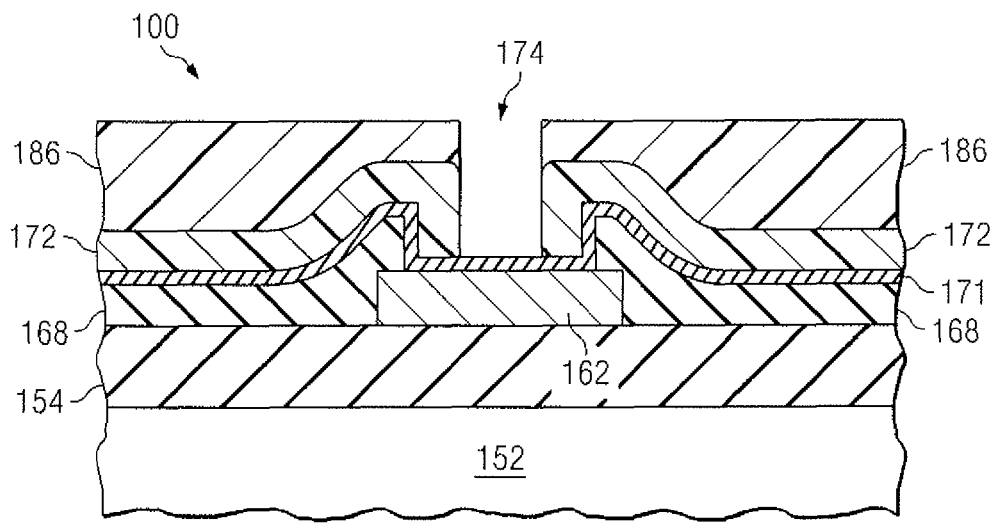

After forming the first opening 170, a thin sacrificial dielectric layer 171 and a SBL 172 on the sacrificial dielectric layer such as a polyimide layer, can be formed over the semiconductor device 100. This is shown in FIG. 4, generally by depositing and patterning a masking layer such as a photoresist layer 186 and then etching the SBL 172 using well known methods to form openings 174 to expose the top surface of bond pad layer 162 having the sacrificial dielectric layer 171 thereon. Although sacrificial dielectric layer 171 is shown on the sidewall of passivation layer 168, depending on step coverage of the deposition process sacrificial layer 171 may not be present or be continuous on the sidewall. Alternately, the SBL may itself be photoimageable, in which case the photoresist layer 186 is generally not needed.

Figure 5:
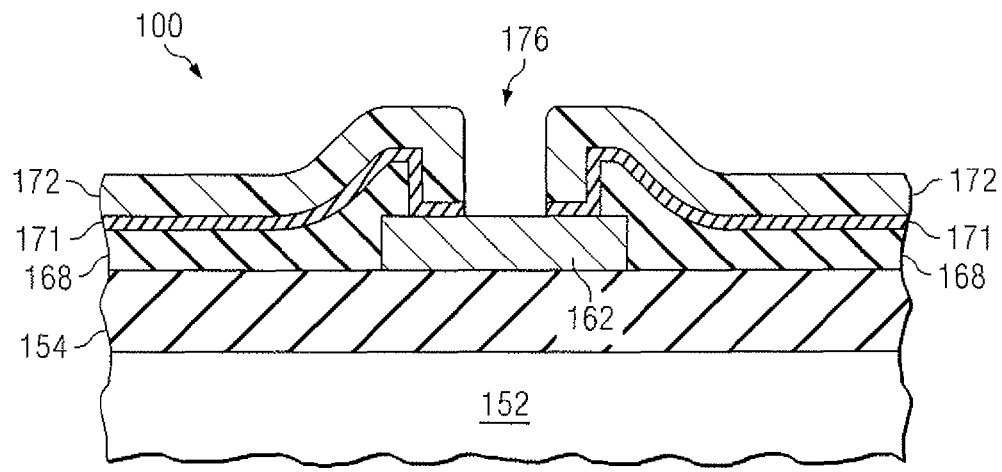

The sacrificial dielectric layer 171 generally comprises a material that matches the passivation material such as SiN or SiON, and is generally <0.1 µm thick. The second opening 174 is generally concentric with the first opening 172. The sacrificial dielectric layer 171 is generally removed using a halogen (e.g. F) based dry etch process before wet etching using the basic etch solution according to embodiments of the invention. Wet etching using the basic etch solution according to embodiments of the invention can occur with photoresist layer 186, if included on device 100, or following removal of photoresist layer 186 to result in the device 100 as shown in FIG. 5, which is ready for bond wire attachment, such as to a gold comprising bond wire.

A significant benefit of using the basic etch solution to etch a surface of the aluminum comprising bond pads discovered by the present Inventors is that the etch performance has non-isotropic aspects that can be readily distinguished from generally isotropic results from etching using acidic solutions, such as phosphoric acid solutions. This non-isotropic etch aspect can significantly reduce undercutting under the passivation layer that can lead to reliability problems.

Applicants present certain theoretical aspects below that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented. The basic etch solution processing according to embodiments of the invention has been found to have a high affinity for etching along the aluminum grain boundary regions. This leads to a significantly roughened surface and thus a larger contact area for contact to the bond wires, and thus the significantly higher bond pull strength observed when using embodiments of the present invention.

Embodiments of the invention can be integrated into a variety of process flows to form a variety of semiconductor devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

EXAMPLES

The following non-limiting Example serves to illustrate selected embodiments of the invention. It will be appreciated that variations in proportions and alternatives in elements of the components shown will be apparent to those skilled in the art and are within the scope of embodiments of the present invention.

Figure 6:
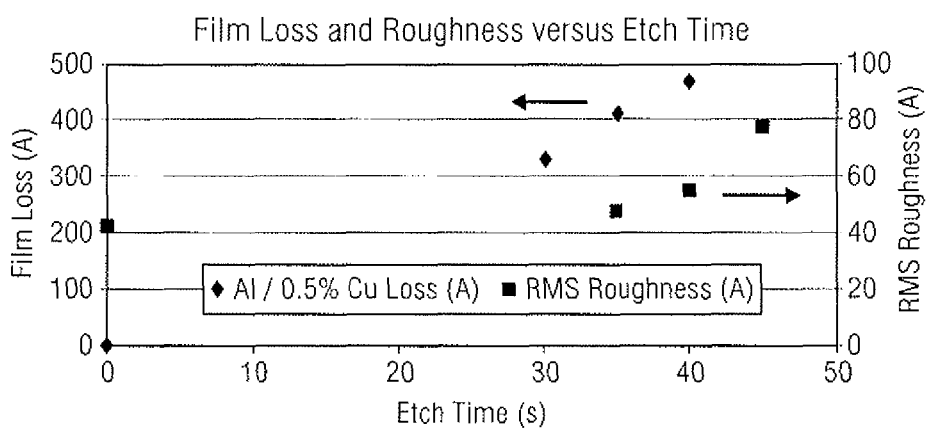
FIG. 6 is a graphical representation of roughness and etch data obtained using an exemplary method for removing contaminants from aluminum-comprising bond pads using a basic etch solution, according to an embodiment of the invention.

Experiments were performed to measure the amount of bond pad material removed and the resulting roughness as a function of etch time, as compared to as-deposited bond pad material. The etch solution comprised 2.38% TMAH in deionized water with a surfactant and the bond pad material comprised Al/0.5 wt. % Cu. All tests were performed at around 25° C. Results are provided below and are also shown in graphical form in FIG. 6.

| Conditions | Amount etched (nm) | RMS Roughness (nm) |
| --- | --- | --- |
| As deposited Al/Cu - no etch | 0 | 4.17 |
| 30 s etch | 330 | n/a |
| 35 s etch | 410 | 4.80 |
| 40 s etch | 470 | 5.49 |
| 45 s etch | n/a | 7.69 |

The results obtained evidence a near doubling of the roughness for a 45 second etch as compared to the as-deposited bond pad material. As described above, basic etch solution processing according to embodiments of the invention provides a high affinity for etching along the aluminum grain boundary regions, leading to a significantly roughened surface and thus a larger contact area for contact to the bond wires. As a result, significantly higher bond pull strength is generally observed when using embodiments of the present invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating an integrated circuit, comprising:
    forming a dielectric layer over a substrate;
    forming a metal layer comprising aluminum over the dielectric layer;
    patterning the metal layer to form a bond pad;
    forming a passivation layer over the dielectric layer and the bond pad;
    patterning the passivation layer, the patterning including depositing and patterning a photoresist layer over the passivation layer and dry etching the passivation layer through the patterned photoresist layer to form an opening to expose a part of a top surface of the bond pad;
    prior to removing the patterned photoresist layer from over the patterned passivation layer, etching to remove a minor portion of the thickness of the bond pad at the exposed part of the bond pad top surface using a wet etch solution comprising tetramethylammonium hydroxide (TMAH); and removing the patterned photoresist layer.

2. The method of claim 1, wherein the minor portion is 150 to 500 Angstroms.

3. The method of claim 2, wherein the metal layer comprises an alloy of aluminum and copper.

4. The method of claim 3, wherein the passivation layer comprises nitride.

5. The method of claim 4, wherein the wet etch solution consists essentially of 1 to 4% TMAH in water.

6. The method of claim 4, wherein the wet etch solution consists essentially of 1 to 4% TMAH in water.

7. The method of claim 5, wherein the exposed part is etched with the wet etch solution for an etch time of 30 to 60 seconds.

8. The method of claim 5, wherein the exposed part is etched with the wet etch solution for an etch time of 30 to 60 seconds.

9. A method of fabricating an integrated circuit, comprising:

forming a first dielectric layer over a substrate;

forming a metal layer comprising aluminum over the first dielectric layer;

patterning the metal layer to form a bond pad;

forming a passivation layer over the first dielectric layer and the bond pad;

patterning the passivation layer to form a first opening to expose a part of a top surface of the bond pad;

forming a second dielectric layer over the patterned passivation layer including within the first opening, providing a lining over first opening sidewalls and the exposed part of the bond pad top surface;

forming a stress buffer layer over the second dielectric layer, including filling the first opening over the lining;

patterning the stress buffer layer to form a second opening through the stress buffer layer and through the lining to expose a central region of the bond pad top surface, leaving a peripheral region of the bond pad top surface covered by the stress buffer layer and liner; and non-isotropically etching the bond pad through the second opening to remove a 150 to 500 Angstroms thickness portion at the exposed central region.

10. The method of claim 9, wherein the stress buffer layer comprises a polybenzoxazole or a polyimide layer.

11. The method of claim 10, wherein the metal layer comprises an alloy of aluminum and copper.

12. The method of claim 11, wherein the passivation layer comprises nitride.

13. The method of claim 12, wherein the bond pad is non-isotropically etched through the second opening using a wet etch solution comprising ammonium hydroxide.

14. The method of claim 13, wherein the wet etch solution comprises tetramethylammonium hydroxide (TMAH).

15. The method of claim 14, wherein the wet etch solution consists essentially of 1 to 4% TMAH in water applied for an etch time of 30 to 60 seconds.

16. The method of claim 9, wherein the bond pad is non-isotropically etched through the second opening using a wet etch solution comprising ammonium hydroxide.

17. The method of claim 16, wherein the wet etch solution comprises tetramethylammonium hydroxide (TMAH).

18. The method of claim 17, wherein the wet etch solution consists essentially of 1 to 4% TMAH in water applied for an etch time of 30 to 60 seconds.

19. The method of claim 17, wherein the stress buffer layer is patterned using a fluorine based dry etch.

\* \* \* \* \*